(12) United States Patent
Rai et al.

(10) Patent No.: US 8,625,284 B2
(45) Date of Patent: Jan. 7, 2014

(54) PRINTED CIRCUIT BOARD SYSTEM FOR AUTOMOTIVE POWER CONVERTER

(75) Inventors: Rutunj Rai, Canton, MI (US); Nadir Sharaf, Bloomfield Township, MI (US)

(73) Assignee: Lear Corporation, Southfield, MI (US)

( * ) Notice: Subject to any disclaimer, the term of this patent is extended or adjusted under 35 U.S.C. 154(b) by 203 days.

(21) Appl. No.: 13/086,842

(22) Filed: Apr. 14, 2011

(65) Prior Publication Data

US 2011/0292615 A1   Dec. 1, 2011

Related U.S. Application Data

(60) Provisional application No. 61/349,285, filed on May 28, 2010.

(51) Int. Cl.
*H05K 7/20* (2006.01)
(52) U.S. Cl.
USPC ...... 361/721; 361/704; 361/707; 361/679.53; 361/679.54; 361/715; 361/719; 165/80.3; 165/104.33; 165/185
(58) Field of Classification Search
USPC .......... 361/679.46, 679.53, 679.54, 688, 698, 361/699, 715–727; 165/80.3, 80.4, 80.5, 165/104.33, 104.34, 185; 62/259.2, 228.1; 257/706–727; 174/16.3, 252, 35, 50, 174/50.52, 35 R, 35 GC
See application file for complete search history.

(56) References Cited

U.S. PATENT DOCUMENTS

| | | | |
|---|---|---|---|
| 3,157,828 A * | 11/1964 | Flaherty ........................ | 361/721 |
| 4,417,297 A * | 11/1983 | Oyama et al. ................. | 361/804 |
| 4,599,680 A | 7/1986 | Gibson et al. | |
| 5,014,904 A | 5/1991 | Morton | |
| 5,390,078 A * | 2/1995 | Taylor ............................ | 361/721 |
| 5,579,217 A * | 11/1996 | Deam et al. .................... | 363/144 |
| 5,619,399 A * | 4/1997 | Mok ............................. | 361/707 |
| 5,703,753 A * | 12/1997 | Mok ............................. | 361/715 |
| 5,729,433 A * | 3/1998 | Mok ............................. | 361/704 |
| 5,933,343 A * | 8/1999 | Lu et al. ........................ | 363/144 |
| 5,966,291 A * | 10/1999 | Baumel et al. ................ | 361/707 |
| 5,986,887 A * | 11/1999 | Smith et al. ................... | 361/704 |
| 6,101,089 A * | 8/2000 | Seto et al. ................ | 361/679.47 |
| 6,304,450 B1 * | 10/2001 | Dibene et al. ................. | 361/704 |
| 7,006,356 B2 * | 2/2006 | Bergmann et al. ............ | 361/736 |
| 7,061,766 B2 * | 6/2006 | Wainwright et al. ......... | 361/719 |
| 7,345,885 B2 * | 3/2008 | Boudreaux et al. ........... | 361/721 |
| 7,375,287 B2 * | 5/2008 | Rathmann ..................... | 174/260 |
| 7,978,471 B2 * | 7/2011 | Tokuyama et al. ........... | 361/699 |
| 8,027,164 B2 * | 9/2011 | Peck ............................. | 361/730 |

(Continued)

FOREIGN PATENT DOCUMENTS

| DE | 1246836 B | 8/1967 |
|---|---|---|
| DE | 69508183 T2 | 10/1999 |

(Continued)

*Primary Examiner* — Michail V Datskovskiy
(74) *Attorney, Agent, or Firm* — Brooks Kushman P.C.

(57) ABSTRACT

An automotive power converter may include a cold plate, a printed circuit board spaced away from the cold plate and including at least one heat generating electrical component attached thereto, and another printed circuit board disposed between the cold plate and the printed circuit board spaced away from the cold plate. The converter may further include at least one thermally conductive element configured to provide a thermally conductive path from the at least one heat generating electrical component to the cold plate. The at least one thermally conductive element may pass through the printed circuit boards.

15 Claims, 3 Drawing Sheets

(56) References Cited

U.S. PATENT DOCUMENTS

| | | |
|---|---|---|
| 2002/0008963 A1 | 1/2002 | DiBene, II et al. |
| 2004/0120120 A1 | 6/2004 | Soto |
| 2004/0212961 A1 | 10/2004 | Harris |
| 2009/0185352 A1 | 7/2009 | Ellsworth et al. |

FOREIGN PATENT DOCUMENTS

| | | |
|---|---|---|
| DE | 10123198 A1 | 12/2002 |
| DE | 102007039800 B3 | 12/2008 |
| EP | 0527359 A2 | 2/1993 |
| JP | 02301159 | 12/1990 |

\* cited by examiner

PRINTED CIRCUIT BOARD SYSTEM FOR AUTOMOTIVE POWER CONVERTER

CROSS-REFERENCE TO RELATED APPLICATION

This application claims the benefit of U.S. provisional Application No. 61/349,285 filed May 28, 2010, the disclosure of which is incorporated by reference in its entirety herein.

TECHNICAL FIELD

This disclosure relates to the cooling of printed circuit board components of automotive power converters.

BACKGROUND

Heat generating elements, such as transformers, drivers, capacitors, etc., attached to a printed circuit board may be cooled via convection. That is, air may be caused to circulate around these elements to dissipate the heat generated by them. Alternatively, heat generating elements attached to a printed circuit board may be cooled via conduction. That is, the printed circuit board may be arranged to be in direct contact with a cold plate to dissipate the heat generated by the heat generating elements.

U.S. Pat. No. 5,014,904 to Morton, for example, discloses a method and apparatus for dissipating heat from printed circuit boards and electronic devices mounted thereon. Printed circuit boards are provided with apertures therethrough for receiving thermal conductor pads. The thermal conductor pads may be secured in the apertures through the use of glue or by means of an interference fit. Glue may also be deposited on top of the thermal conductor pad to secure an electronic device thereto. The glue is cured in a manner that limits its thickness to a minimum value. The electronic device may be further secured to the printed circuit board by wave soldering. The opposite end of the thermal conductor pad contacts the cold plate.

SUMMARY

An automotive power converter may include a cold plate, a first printed circuit board in contact with the cold plate, and a second printed circuit board stacked on top of and spaced away from the first printed circuit board. The second printed circuit board may include a plurality of heat generating electrical components attached thereto. The converter may further include a thermally conductive arrangement passing through the first and second printed circuit boards and in contact with the heat generating electrical components and cold plate. The thermally conductive arrangement may be configured to provide a thermally conductive path from the heat generating electrical components to the cold plate.

A printed circuit board system may include a first printed circuit board including a surface defining a passageway therethrough, a second printed circuit board spaced away from the first printed circuit board and including a surface defining a passageway therethrough, and a plurality of heat generating elements attached to the first printed circuit board. The system may further include a thermally conductive arrangement in contact with the heat generating elements and passing through the passageways of the printed circuit boards.

An automotive power converter may include a cold plate, a printed circuit board spaced away from the cold plate and including at least one heat generating electrical component attached thereto, and another printed circuit board disposed between the cold plate and the printed circuit board spaced away from the cold plate. The converter may further include at least one thermally conductive element configured to provide a thermally conductive path from the at least one heat generating electrical component to the cold plate. The at least one thermally conductive element may pass through the printed circuit boards.

DETAILED DESCRIPTION

Figure 1:
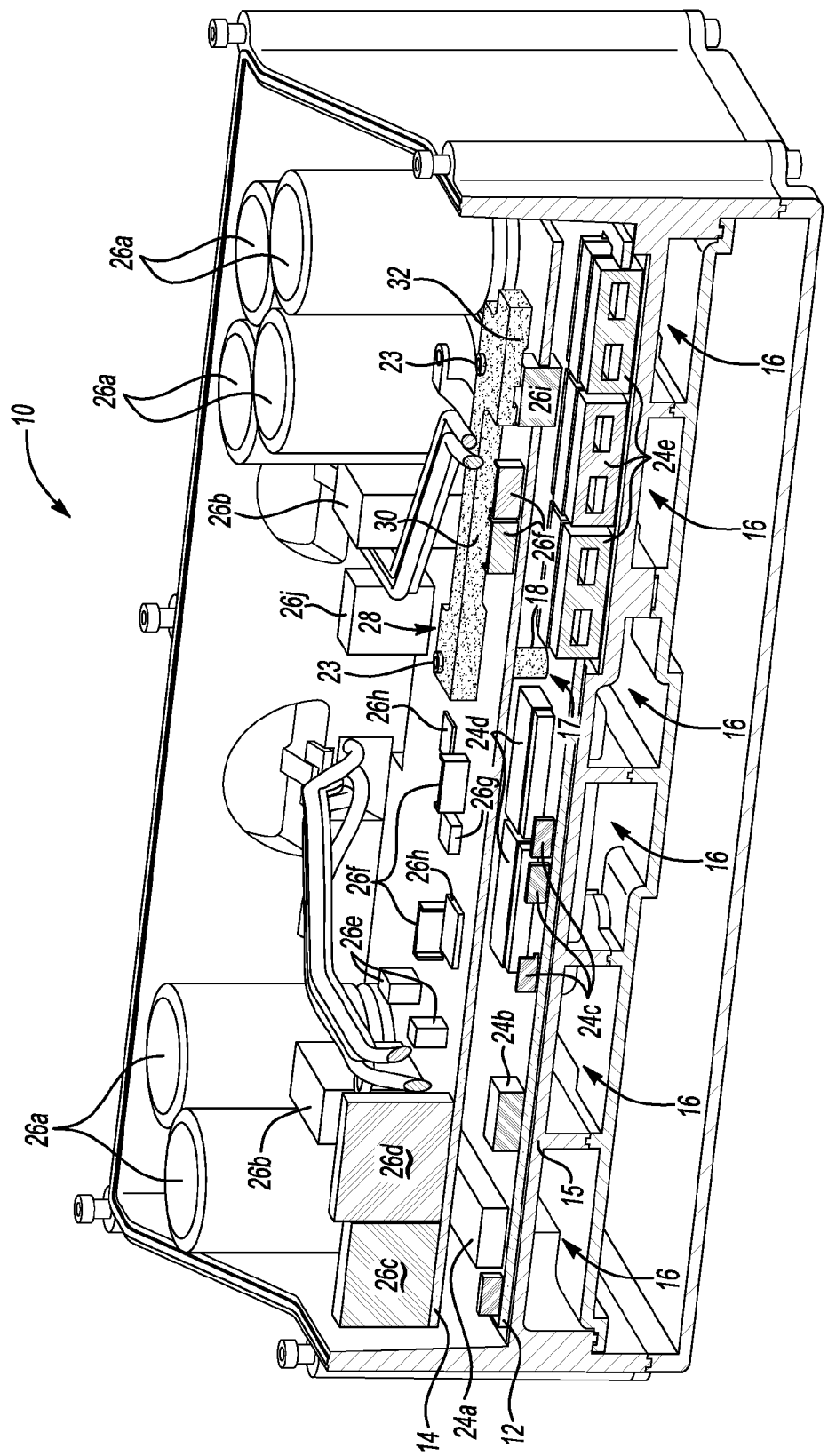
FIG. 1 is a perspective view, in cross-section, of a high power electronics module for a vehicle battery charger.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Certain electrical components, such as transformers, drivers, capacitors, etc., attached to printed circuit boards may generate heat during operation. This heat, if not effectively dissipated, may affect the operation of the electrical circuitry associated with the printed circuit boards.

For packaging reasons, certain printed circuit board systems for automotive power converters (e.g., battery chargers, inverters, etc.) may have a number of printed circuit boards stacked on top of and spaced away from each other. Each of these printed circuit boards may have heat generating elements attached to them. As mentioned above, heat generated by these heat generating elements may need to be dissipated. A cold plate may be arranged, for example, to directly contact the printed circuit board at the bottom of the stack. Heat generated by the heat generating elements attached to the bottom printed circuit board may thus be dissipated via conduction as well as convection. Heat generated by the heat generating elements attached to the other printed circuit boards may be dissipated exclusively via convection as these other printed circuit boards may not directly contact the cold plate. Conduction, however, may be a more effective mechanism to remove heat from heat generating elements as compared with convection.

A thermal path (or paths) may be provided from one or more heat generating elements (mounted to a printed circuit board) to a cold plate in arrangements where the printed circuit board is spaced away from the cold plate. This thermal path, for example, may comprise one or more thermally conductive elements that provide a pathway for heat to travel from the one or more heat generating elements to the cold plate. The one or more thermally conductive elements may be in contact with and/or attached to the heat generating elements and/or the cold plate.

As an example, a network of copper wiring (round, flat, etc.) may be arranged to be in contact with a collection of heat generating elements attached to a printed circuit board. Any suitable thermally conductive material having any suitable shape/configuration/etc., however, may be used. The wiring, in this example, at least partially contacts (and lies along) a surface of the printed circuit board (the same surface on which the heat generating elements are attached). In other examples however, the wiring may be spaced away from a surface of the printed circuit board or arranged as desired.

The printed circuit board, in this example, is spaced away from a cold plate by a plurality of thermally conductive (e.g., metal) spacing elements. Other printed circuit boards and/or components, of course, may be disposed between the cold plate and printed circuit board having the network of copper wiring. At least one of the metal spacing elements is in contact with the cold plate and at least a portion of the copper wiring. Hence, heat generated by the heat generating elements may travel through the wiring and spacing elements to the cold plate. Other arrangements are also possible. Wiring, for example, may be arranged to be in contact with and/or attached to the heat generating elements and the cold plate.

Figure 2:
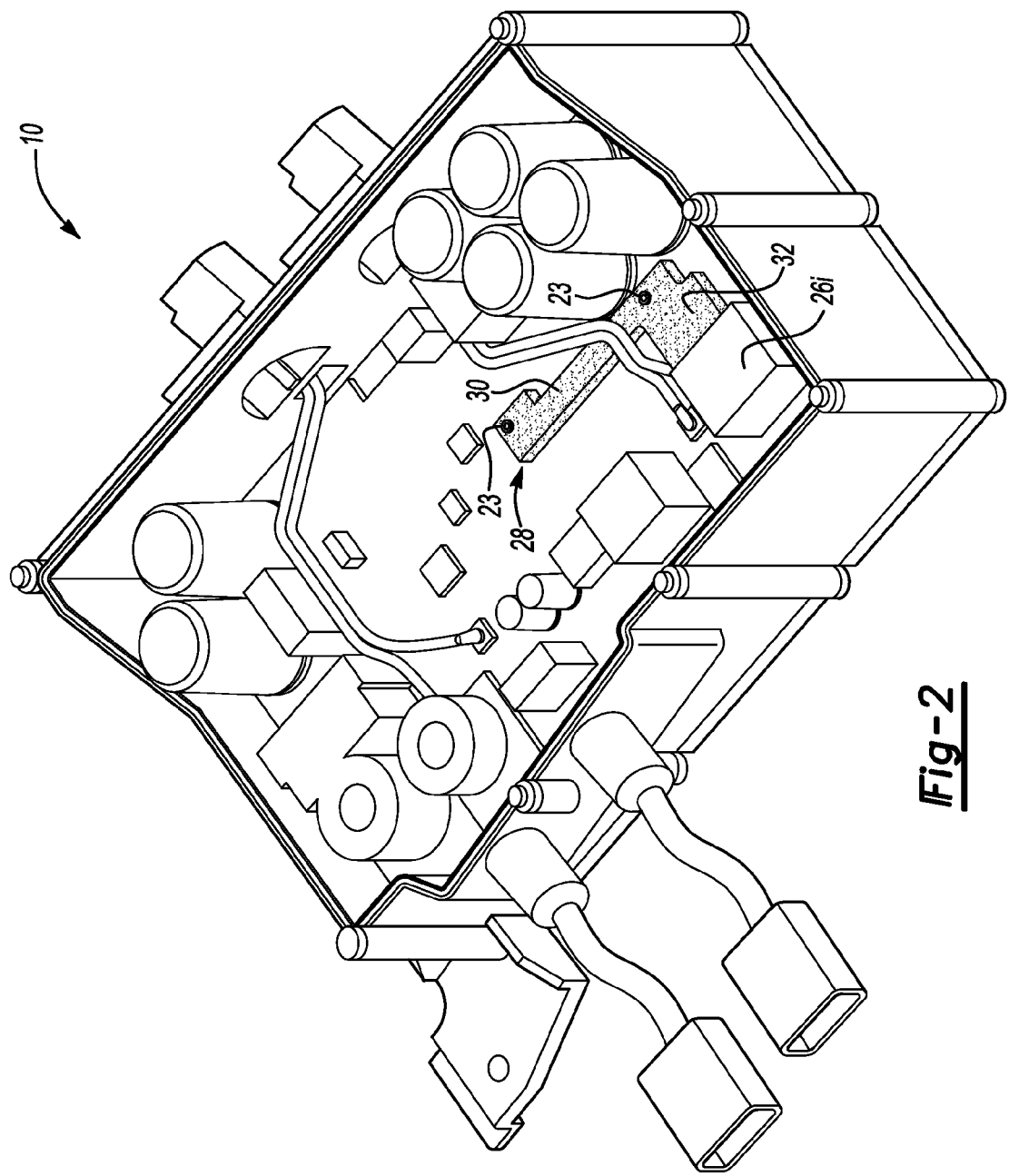
FIG. 2 is a perspective view of the high power electronics module of FIG. 1.

Referring to FIGS. 1 and 2 (which label fewer elements than illustrated for clarity purposes), a printed circuit board system 10 includes printed circuit boards 12, 14 stacked on top of and spaced away from each other, and a cold plate 15. As known in the art, the cold plate 15 at least partially defines a plurality of fluid passageways 16. A coolant, such as water, may pass through the passageways 16 to cool the cold plate 15.

Figure 3:
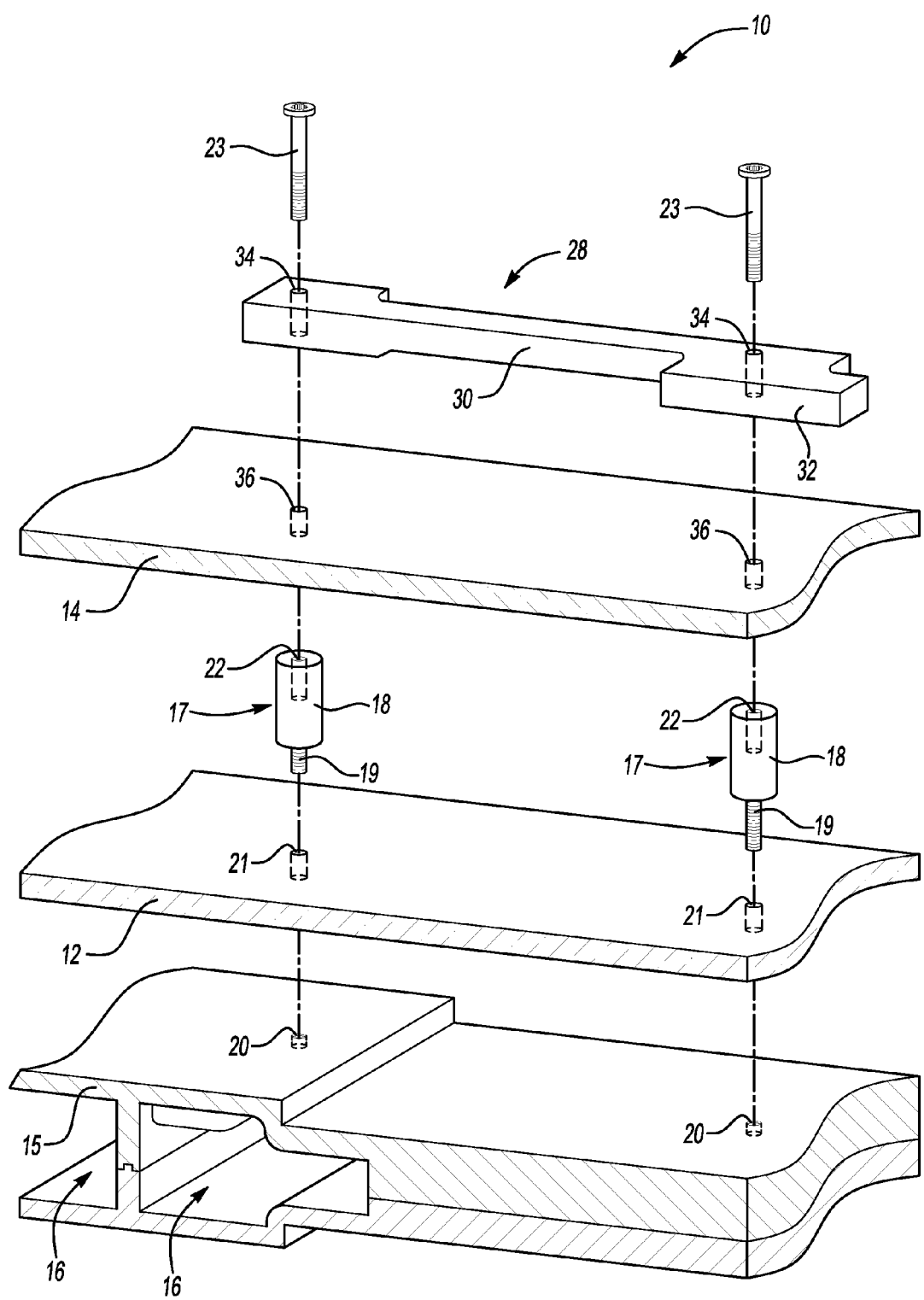
FIG. 3 is an exploded perspective view of portions of the high power electronics module of FIG. 1.

The printed circuit board 12 is in contact with the cold plate 15. The printed circuit board 14 is spaced away from the cold plate 15 via a plurality of thermally conductive standoffs 17. Referring to FIG. 3, each of the standoffs 17 may include a spacer portion 18 and a male threaded portion 19 extending from the spacer portion 18. The male threaded portion 19 is configured to engage a corresponding female threaded portion 20 in the cold plate 15. (The printed circuit board 12, in certain embodiments, may include passageways 21 through which each of the male threaded portions 19 may pass.) Each of the spacer portions 18 may further include a female threaded portion 22 formed therein. As discussed in further detail below, each of these female threaded portions 22 may receive a threaded fastener 23.

Referring again to FIGS. 1 and 2, the printed circuit board 12 has a plurality of electrical components 24$n$ (24$a$, 24$b$, 24$c$, etc.—not all of which are necessarily numbered), such as capacitors, amplifiers, transformers, etc., attached thereto. Likewise, the printed circuit board 14 has a plurality of electrical components 26$n$ (26$a$, 26$b$, 26$c$, etc.—not all of which are necessarily numbered), such as capacitors, amplifiers, transformers, drivers, etc., attached thereto. Certain of the electrical components 26$n$ generate heat during operation. One such component is transformer 26$i$.

Referring now to FIGS. 1, 2 and 3, the printed circuit board system 10 further includes a thermally conductive heat spreader 28 (e.g., a metal stamping, a wire, etc.) The heat spreader 28 includes a trunk portion 30, at least one branch portion 32, and surfaces defining passageways 34. The at least one branch portion 32 is in contact with at least one of the heat generating components (e.g., 26$i$). The trunk portion 30 is mounted to at least one of the standoffs 17 via, for example, the threaded fasteners 23, which pass through the passageways 34 and engage the female threaded portions 22 formed within the spacer portions 18. (The printed circuit board 14 may include surfaces defining passageways 36 through which each of the fasteners 23 may pass.)

During operation, heat generated by the transformer 26$i$, for example, is transferred (via conduction) to the branch portion 32 of the heat spreader 28 in contact therewith. This heat travels through the trunk portion 30 and to the spacer portions 18 of the standoffs 17 via the threaded fasteners 23 mounting the trunk portion 30 to the spacer portions 18. Finally, heat transferred to the spacer portions 18 is transmitted to the cold plate 15 via the male threaded fastener portions 19 of the standoffs 17 engaged with the cold plate 15.

The branch and trunk configuration of the heat spreader 28 described above reduces the number of passageways through the printed circuit boards 12, 14 needed to accommodate thermally conductive elements configured to transfer heat from the electrical components 26$n$ to the cold plate 15. That is, each of the electrical components 26$n$ need not have their own dedicated thermally conductive element and corresponding passageway through the printed circuit boards 12, 14 (which may be impractical in circumstances where printed circuit boards are stacked on top of and spaced away from each other as such dedicated thermally conductive elements and corresponding passageways may preclude the packaging of printed circuit board components below them within the stack). Rather, a plurality of branches, each in contact with a respective heat generating electrical component 26$n$, may lead to a single trunk. This trunk may have relatively few thermal connections (which may be strategically positioned so as to not interfere with printed circuit board components below them within the stack) to the cold plate 15 as in the example of FIGS. 1, 2 and 3.

While embodiments of the invention have been illustrated and described, it is not intended that these embodiments illustrate and describe all possible forms of the invention. In the embodiment of FIGS. 1, 2 and 3, for example, the thermally conductive path from the heat generating element 26$i$ to the cold plate 15 includes several components (e.g., the heat spreader 28, fasteners 23 and standoffs 17). This thermally conductive path, in other embodiments, may comprise a single component that contacts some/all of the heat generating elements as well as spaces the printed circuit board away from the cold plate. Alternatively, the standoffs 17 may provide a passageway therethrough for a threaded fastener that connects the heat spreader 28 to the cold plate 15. In still other embodiments, the heat spreader 28 may include a plurality of sub-elements connected together in any suitable/known fashion, etc. Other arrangements are also possible.

The words used in the specification are words of description rather than limitation, and it is understood that various changes may be made without departing from the spirit and scope of the invention. Additionally, the features of various implementing embodiments may be combined to form further embodiments of the invention.

What is claimed is:

1. An automotive power converter comprising:
   a cold plate;
   a first printed circuit board in contact with the cold plate;
   a second printed circuit board stacked on top of and spaced away from the first printed circuit board, the second printed circuit board including a plurality of heat generating electrical components attached thereto; and
   a thermally conductive arrangement passing through the first and second printed circuit boards and in contact with the heat generating electrical components and cold plate, the thermally conductive arrangement configured to provide a thermally conductive path from the heat generating electrical components to the cold plate and including a heat spreader having a trunk portion and a plurality of branch portions, each of the branch portions being in thermal contact with one of the heat generating electrical components.

2. The converter of claim 1 wherein the thermally conductive arrangement further includes a spacer portion configured to support the second printed circuit board and to space the second printed circuit board away from the first printed circuit board.

3. The converter of claim 2 wherein the thermally conductive arrangement further includes a fastener configured to attach the heat spreader to the spacer portion.

4. The converter of claim 3 wherein the fastener passes through the second printed circuit board.

5. A printed circuit board system comprising:
a first printed circuit board including a surface defining a passageway therethrough;
a second printed circuit board spaced away from the first printed circuit board and including a surface defining a passageway therethrough;
a plurality of heat generating elements attached to the first printed circuit board; and
a thermally conductive arrangement in thermal contact with the heat generating elements and passing through the passageways of the printed circuit boards, wherein the thermally conductive arrangement includes a heat spreader having a trunk portion and a plurality of branch portions and wherein each of the branch portions is in thermal contact with one of the heat generating elements.

6. The system of claim 5 further comprising a cold plate in contact with the second printed circuit board, wherein the thermally conductive arrangement is in contact with the cold plate.

7. The system of claim 6 wherein the thermally conductive arrangement is attached to the cold plate.

8. The system of claim 5 wherein the thermally conductive arrangement further includes a spacer portion configured to support the first printed circuit board and to space the first printed circuit board away from the second printed circuit board.

9. The system of claim 8 wherein the thermally conductive arrangement further includes a fastener configured to attach the heat spreader to the spacer portion.

10. The system of claim 5 wherein the thermally conductive arrangement includes a metal.

11. An automotive power converter comprising:
a cold plate;
a printed circuit board spaced away from the cold plate and including at least one heat generating electrical component attached thereto;
another printed circuit board disposed between the cold plate and the printed circuit board spaced away from the cold plate; and
at least one thermally conductive element configured to provide a thermally conductive path from the at least one heat generating electrical component to the cold plate, wherein the at least one thermally conductive element passes through the printed circuit boards and includes a spacer portion configured to support the printed circuit board and to space the printed circuit board away from the another printed circuit board.

12. The converter of claim 11 wherein the at least one thermally conductive element is in thermal contact with the at least one heat generating electrical component and the cold plate.

13. The converter of claim 11 wherein the at least one thermally conductive element is attached to the cold plate.

14. The converter of claim 11 wherein the at least one thermally conductive element further includes a heat spreader having a trunk portion and a plurality of branch portions and wherein each of the branch portions is in thermal contact with one of the at least one heat generating electrical component.

15. The converter of claim 11 wherein the at least one thermally conductive element further includes a fastener configured to attach the heat spreader to the spacer portion.

* * * * *

UNITED STATES PATENT AND TRADEMARK OFFICE
CERTIFICATE OF CORRECTION

| | | |
|---|---|---|
| PATENT NO. | : 8,625,284 B2 | Page 1 of 1 |
| APPLICATION NO. | : 13/086842 | |
| DATED | : January 7, 2014 | |
| INVENTOR(S) | : Rutunj Rai et al. | |

It is certified that error appears in the above-identified patent and that said Letters Patent is hereby corrected as shown below:

In the Claims:

Column 4, Line 57, Claim 1:

After "printed circuit boards and in"
Insert -- thermal --.

Signed and Sealed this
Third Day of June, 2014

Michelle K. Lee
*Deputy Director of the United States Patent and Trademark Office*